(12) United States Patent
Chen

(10) Patent No.: US 8,963,638 B2
(45) Date of Patent: Feb. 24, 2015

(54) OPERATIONAL AMPLIFIER CIRCUIT

(71) Applicant: Novatek Microelectronics Corp., Hsinchu (TW)

(72) Inventor: Ji-Ting Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/776,732

(22) Filed: Feb. 26, 2013

(65) Prior Publication Data

US 2014/0125414 A1 May 8, 2014

(30) Foreign Application Priority Data

Nov. 7, 2012 (TW) .............................. 101141433 A

(51) Int. Cl.
*H03F 3/45* (2006.01)
(52) U.S. Cl.
CPC ................................ *H03F 3/45224* (2013.01)
USPC .......................................... 330/255; 330/261

(58) Field of Classification Search
CPC ........................................................ H03F 3/45
USPC ........................... 330/255, 261, 51, 264, 265
See application file for complete search history.

(56) References Cited

U.S. PATENT DOCUMENTS

| 8,054,134 | B2 * | 11/2011 | Huang et al. .................. 330/292 |
| 8,395,448 | B2 * | 3/2013 | Ivanov et al. ................. 330/292 |
| 8,653,893 | B2 * | 2/2014 | Tsuchi .......................... 330/255 |
| 2004/0263230 | A1 * | 12/2004 | Mori et al. .................... 327/307 |

* cited by examiner

*Primary Examiner* — Henry Choe
(74) *Attorney, Agent, or Firm* — Jianq Chyun IP Office

(57) ABSTRACT

An operational amplifier circuit includes an output stage circuit. The output stage circuit includes a first and a second output transistors, a capacitor unit, and a switch unit. A drain of the first output transistor is coupled to a drain of the second output transistor via an output terminal of the output stage circuit. The switch unit is coupled between gates of the first and the second output transistors and coupled to a first terminal of the capacitor unit. A second terminal of the capacitor unit is coupled to the output terminal of the output stage circuit. The switch unit determines to conduct a signal transmission path between the gate of the first output transistor and the first terminal of the capacitor unit or conduct a signal transmission path between the gate of the second output transistor and the first terminal of the capacitor unit according to a control signal.

18 Claims, 4 Drawing Sheets

OPERATIONAL AMPLIFIER CIRCUIT

CROSS-REFERENCE TO RELATED APPLICATION

This application claims the priority benefit of Taiwan application serial no. 101141433, filed on Nov. 7, 2012. The entirety of the above-mentioned patent application is hereby incorporated by reference herein and made a part of this specification.

BACKGROUND OF THE INVENTION

1. Field of Invention

The invention relates to a load driving circuit, and more particularly, to an operational amplifier circuit.

2. Description of Related Art

An operational amplifier plays a significant role in integrated circuit (IC) design and has been extensively applied to high-fidelity stereo equipment, micro-computers, and other electronic devices. Besides, the operational amplifier is able to enhance a driving capability of an output signal to drive a load or the next-stage circuit.

FIG. 1 is a schematic diagram outlining a conventional digitally-controlled analog voltage driving circuit. With reference to FIG. 1, the driving circuit 100 includes a digital-to-analog converter (DAC) 110 and an operational amplifier 120. The DAC 110 receives a digital signal SD, converts the received digital signal SD into an analog signal SA, and outputs the analog signal SA to the operational amplifier 120. Here, the operational amplifier 120 has a negative feedback configuration and a unity gain. When the operational amplifier 120 receives different input voltages, the corresponding output voltages may vary, and the variation speed is the so-called slew rate which is determined by an input stage current and compensation capacitors of the operational amplifier 120.

In particular, when the digitally-controlled analog voltage driving circuit is applied, an output stage circuit of the operational amplifier 120 often includes a plurality of compensation capacitors to stabilize the operational amplifier 120. For instance, the DAC 110 may have two output ranges according to the most significant bits (MSB) of the 8-bit digital signal SD. FIG. 2 is a schematic diagram illustrating comparison between the two output ranges of the DAC 110. With reference to FIG. 2, when the MSB of the digital signal SD is 1 (MSB=1), the corresponding voltage range refers to the high-level output V2 to V3; when the MSB of the digital signal SD is 0 (MSB=0), the corresponding voltage range refers to the low-level output V1 to V2. In compliance with said digital control, two capacitors are often configured within the output stage circuit of the operational amplifier 120, so as to compensate the stability of the operational amplifier 120. Particularly, one of the two capacitors is responsible for compensating the high-level output of the DAC 110, while the other capacitor is responsible for compensating the low-level output of the DAC 110.

In said design, however, the compensation capacitors often occupy an excessively large area of the chip. If the number of the compensation capacitors is reduced to raise the slew rate, the operational amplifier may accordingly oscillate. Hence, how to equip the output stage circuit of the operational amplifier with an appropriate capacitance compensation scheme is one of the leading topics in the pertinent art.

SUMMARY OF THE INVENTION

An embodiment of the invention provides an operational amplifier circuit. According to a control signal, the operational amplifier circuit switches different compensation capacitors of an output stage circuit to be coupled to different output transistors.

In an embodiment of the invention, an operational amplifier circuit that includes an input stage circuit, a bias circuit, and an output stage circuit is provided. The input stage circuit has an input terminal that receives an input signal. The bias circuit is coupled to the input stage circuit and provides a bias current to the input stage circuit. The output stage circuit is coupled to the bias circuit. Besides, the output stage circuit has an output terminal. Here, the output stage circuit includes a pair of output transistors, a capacitor unit, and a switch unit. The pair of output transistors includes a first output transistor and a second output transistor. A first source/drain of the first output transistor is coupled to a first source/drain of the second output transistor via the output terminal of the output stage circuit. The capacitor unit has a first terminal and a second terminal. A second terminal of the capacitor unit is coupled to the output terminal of the output stage circuit. The switch unit is coupled between a gate of the first output transistor and a gate of the second output transistor and coupled to the first terminal of the capacitor unit. According to a control signal, the switch unit determines to conduct a signal transmission path between the gate of the first output transistor and the first terminal of the capacitor unit or conduct a signal transmission path between the gate of the second output transistor and the first terminal of the capacitor unit.

According to an embodiment of the invention, the capacitor unit includes a first capacitor. The first capacitor has a first terminal and a second terminal. The first terminal of the first capacitor is coupled to the first terminal of the capacitor unit, and the second terminal of the first capacitor is coupled to the second terminal of the capacitor unit.

According to an embodiment of the invention, the switch unit includes a first switch and a second switch. The first switch has a first terminal, a second terminal, and a control terminal. The first terminal of the first switch is coupled to the gate of the first output transistor, the second terminal of the first switch is coupled to the first terminal of the first capacitor, and the control terminal of the first switch is controlled by an inverted control signal. The second switch has a first terminal, a second terminal, and a control terminal as well. The second terminal of the second switch is coupled to the gate of the second output transistor, the first terminal of the second switch is coupled to the first terminal of the first capacitor, and the control terminal of the second switch is controlled by the control signal.

According to an embodiment of the invention, when the first switch conducts the signal transmission path between the gate of the first output transistor and the first terminal of the first capacitor, the second switch cuts off the signal transmission path between the gate of the second output transistor and the first terminal of the first capacitor. When the second switch conducts the signal transmission path between the gate of the second output transistor and the first terminal of the first capacitor, the first switch cuts off the signal transmission path between the gate of the first output transistor and the first terminal of the first capacitor.

According to an embodiment of the invention, the capacitor unit includes a plurality of second capacitors. Each of the second capacitors has a first terminal and a second terminal. Each of the first terminals of the second capacitors is coupled to the first terminal of the capacitor unit, and each of the second terminals of the second capacitors is coupled to the second terminal of the capacitor unit.

According to an embodiment of the invention, the switch unit includes a plurality of third switches and a plurality of fourth switches. Each of the third switches has a first terminal, a second terminal, and a control terminal. Each of the first terminals of the third switches is coupled to the gate of the first output transistor, each of the second terminals of the third switches is exclusively coupled to one of the first terminals of the second capacitors, and each of the control terminals of the third switches is controlled by an inverted control signal. Each of the fourth switches has a first terminal, a second terminal, and a control terminal. Each of the second terminals of the fourth switches is coupled to the gate of the second output transistor, each of the first terminals of the fourth switches is exclusively coupled to one of the first terminals of the second capacitors, and each of the control terminals of the fourth switches is controlled by the control signal.

According to an embodiment of the invention, when each of the third switches conducts the signal transmission path between the gate of the first output transistor and each of the first terminals of the second capacitors, each of the fourth switches cuts off the signal transmission path between the gate of the second output transistor and each of the first terminals of the second capacitors. When each of the fourth switches conducts the signal transmission path between the gate of the second output transistor and each of the first terminals of the second capacitors, each of the third switches cuts off the signal transmission path between the gate of the first output transistor and each of the first terminals of the second capacitors.

According to an embodiment of the invention, when one of the third switches conducts the signal transmission path between the gate of the first output transistor and one of the first terminals of the second capacitors, the other third switches cut off the signal transmission paths between the gate of the first output transistor and the first terminals of the other second capacitors.

According to an embodiment of the invention, when a first part of the third switches conducts the signal transmission paths between the gate of the first output transistor and the first terminals of a first part of the second capacitors, a second part of the third switches cuts off the signal transmission paths between the gate of the first output transistor and the first terminals of a second part of the second capacitors.

According to an embodiment of the invention, when one of the fourth switches conducts the signal transmission path between the gate of the second output transistor and one of the first terminals of the second capacitors, the other fourth switches cut off the signal transmission paths between the gate of the second output transistor and the first terminals of the other second capacitors.

According to an embodiment of the invention, when a first part of the fourth switches conducts the signal transmission paths between the gate of the second output transistor and the first terminals of a first part of the second capacitors, a second part of the fourth switches cuts off the signal transmission paths between the gate of the second output transistor and the first terminals of a second part of the second capacitors.

According to an embodiment of the invention, the capacitor unit further has a third terminal and a fourth terminal. The third terminal of the capacitor unit is coupled to the gate of the first output transistor, and the fourth terminal of the capacitor unit is coupled to the gate of the second output transistor.

According to an embodiment of the invention, the capacitor unit includes a third capacitor and a fourth capacitor. The third capacitor has a first terminal and a second terminal. The first terminal of the third capacitor is coupled to the gate of the first output transistor, and the second terminal of the third capacitor is coupled to the output terminal of the output stage circuit. The fourth capacitor has a first terminal and a second terminal. The second terminal of the fourth capacitor is coupled to the gate of the second output transistor, and the first terminal of the fourth capacitor is coupled to the output terminal of the output stage circuit.

According to an embodiment of the invention, the output terminal of the output stage circuit is coupled to the input terminal of the input stage circuit to constitute a feedback circuit configuration.

According to an embodiment of the invention, a second source/drain of the first output transistor is coupled to a first system voltage, and a second source/drain of the second output transistor is coupled to a second system voltage.

According to an embodiment of the invention, the control signal is the most significant bit (MSB) of a digital signal corresponding to the input signal.

In view of the above, according to an embodiment of the invention, the output stage circuit includes the capacitor unit and the switch unit. The operational amplifier circuit switches the switch unit according to the control signal, such that the capacitor unit is able to compensate the operational amplifier circuit based on different voltage ranges.

In order to make the aforementioned and other features and advantages of the invention comprehensible, embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DETAILED DESCRIPTION OF DISCLOSED EMBODIMENTS

Figure 1:
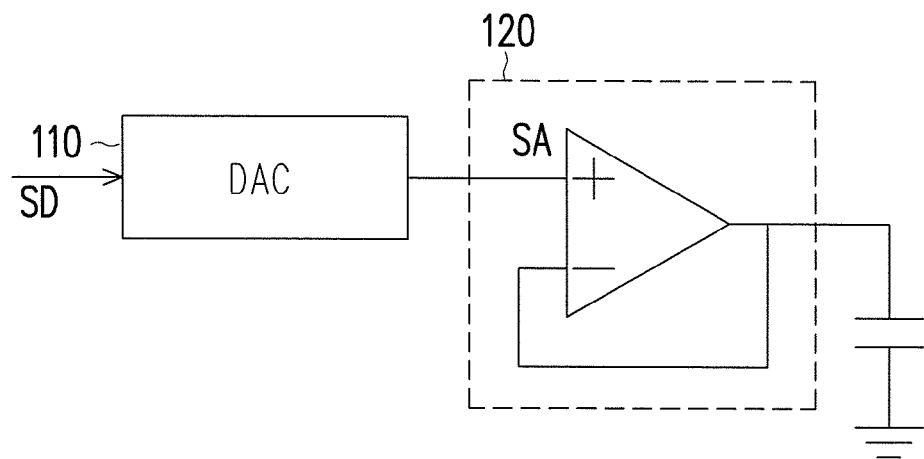
FIG. 1 is a schematic diagram outlining a conventional digitally-controlled analog voltage driving circuit.
Figure 2:
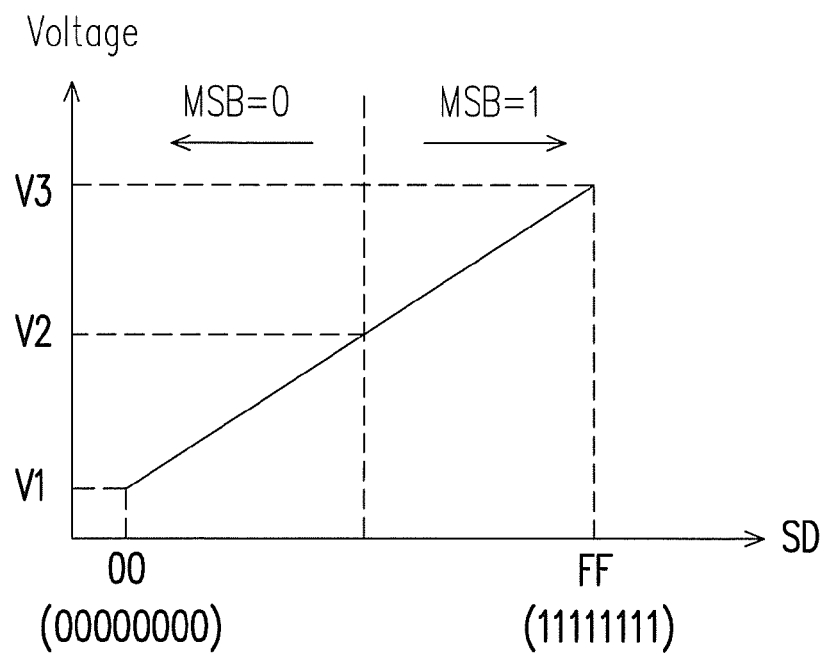
FIG. 2 is a schematic diagram illustrating comparison between the two output ranges of the DAC 110.
Figure 3:
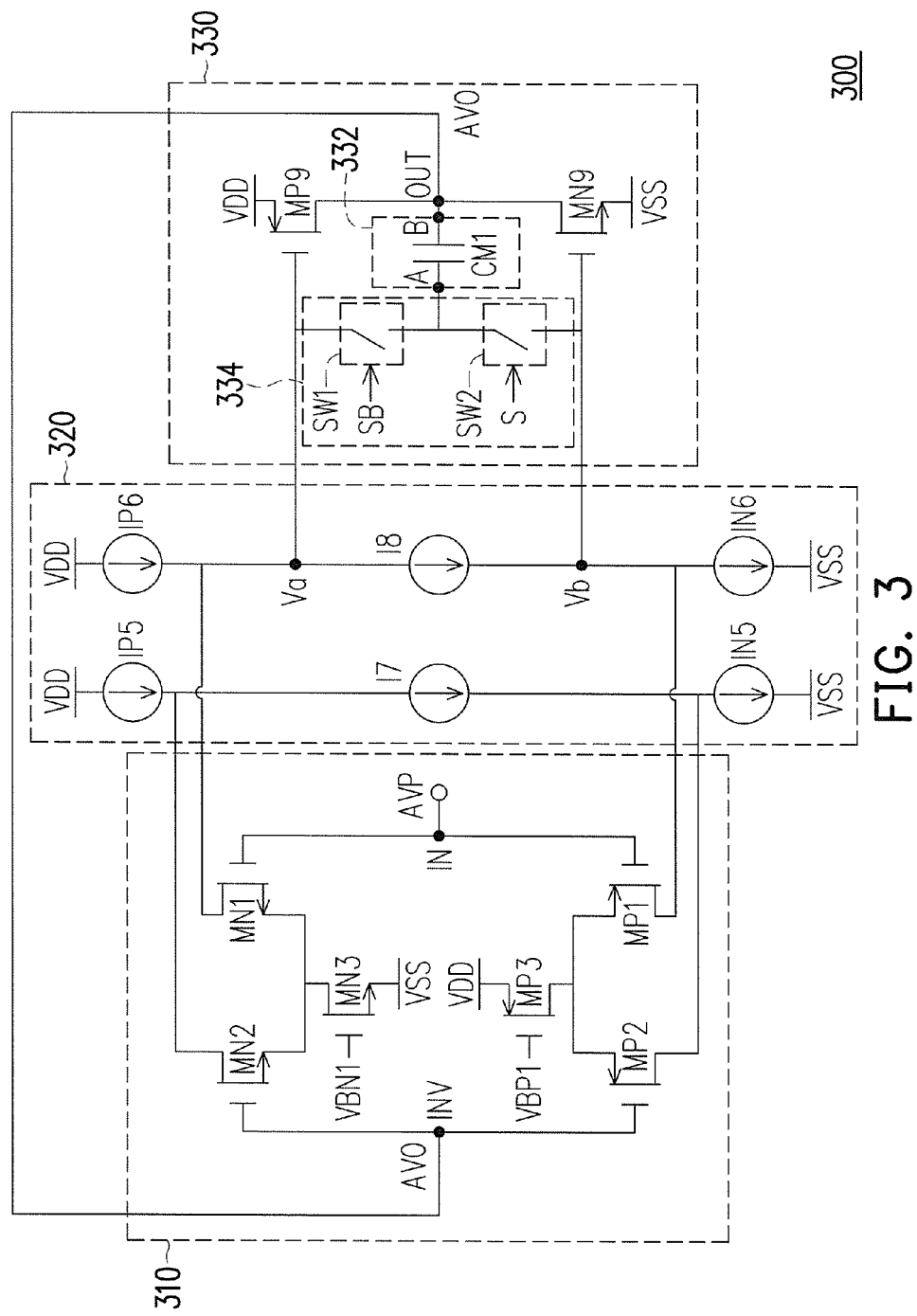
FIG. 3 is a schematic diagram outlining an operational amplifier circuit according to an embodiment of the invention.

FIG. 3 is a schematic diagram outlining an operational amplifier circuit according to an embodiment of the invention. With reference to FIG. 3, an operational amplifier circuit 300 described in the present embodiment includes an input stage circuit 310, a bias circuit 320, and an output stage circuit 330. The input stage circuit 310 has an inverting input terminal INV and a non-inverting input terminal IN that receive differential input signals AVO and AVP, respectively. Particularly, in the present embodiment, the input stage circuit 310 includes n-type field effect transistors MN1, MN2, and MN3 and p-type field effect transistors MP1, MP2, and MP3. The n-type field effect transistors MN1 and MN2 and the p-type field effect transistors MP1 and MP2 respectively constitute differential input pairs. In the present embodiment, the inverting input terminal INV of the operational amplifier circuit 300 is coupled to an output terminal OUT of the output stage circuit 330, for instance. Therefore, the two differential input pairs not only receive the differential input signal AVP but also receive the output signal AVO output by the output stage circuit 330, so as to constitute the feedback circuit configuration with unity gain. However, the invention is not limited thereto. In another embodiment of the invention, the inverting input terminal of the input stage circuit 310 may also receive a differential input signal AVN (not shown) corresponding to the differential input signal AVP.

In the present embodiment, the bias circuit 320 is coupled to the input stage circuit 310 and provides bias currents IP5 and IP6 to the input stage circuit 310. Practically, the bias currents IP5 and IP6 are implemented in form of a transistor circuit with a current mirror configuration. Hence, the n-type field effect transistor MN3 and the p-type field effect transistor MP3 in the input stage circuit 310 are, together with the bias currents IP5 and IP6, applied to bias the differential input pair and serve as the current source.

In the present embodiment, the output stage circuit 330 includes a pair of complementary output transistors MP9 and MN9, a capacitor unit 332, and a switch unit 334. The pair of output transistors MP9 and MN9 includes a first output transistor MP9 and a second output transistor MN9. In the present embodiment, the first output transistor MP9 refers to the p-type field effect transistor, and the second output transistor MN9 refers to the n-type field effect transistor. A drain of the first output transistor MP9 is coupled to a drain of the second output transistor MN9 via the output terminal OUT. A source of the first output transistor MP9 is coupled to a first system voltage VDD, and a source of the second output transistor MN9 is coupled to a second system voltage VSS.

When the output stage circuit 330 is required to provide a large current to the load driven by the output stage circuit 330 or to the next stage circuit, the operational amplifier circuit 300 utilizes the bias point Va of the bias circuit 320, such that there exists a relatively large voltage difference between the source and a gate of the first output transistor MP9. Thereby, a relatively large current is provided to the load driven by the output stage circuit 330 or to the next stage circuit. When the output stage circuit 330 is required to extract a large current from the load driven by the output stage circuit 330 or v the next stage circuit, the operational amplifier circuit 300 utilizes the bias point Vb of the bias circuit 320, such that there exists a relatively large voltage difference between the source and a gate of the second output transistor MN9. Thereby, a relatively large current is retrieved from the load driven by the output stage circuit 330 or from the next stage circuit.

In the present embodiment, the capacitor unit 332 serves to compensate the operational amplifier circuit 330, so as to stabilize the operational amplifier circuit 330. The capacitor unit 332 has a first terminal A and a second terminal B. The first terminal A of the capacitor unit 332 is coupled to the switch unit 334. The second terminal B of the capacitor unit 332 is coupled to the output terminal OUT of the output stage circuit 330. Specifically, the capacitor unit 332 described in the present embodiment includes a first capacitor CM1. The first capacitor CM1 has a first terminal and a second terminal. The first terminal of the first capacitor CM1 is coupled to the first terminal A of the capacitor unit 332, and the second terminal of the first capacitor CM1 is coupled to the second terminal B of the capacitor unit 332.

According to the present embodiment, the switch unit 334 is coupled between the gate of the first output transistor MP9 and the gate of the second output transistor MN9 and coupled to the first terminal A of the capacitor unit 332. According to a control signal S, the switch unit 334 determines to conduct a signal transmission path between the gate of the first output transistor MP9 and the first terminal A of the capacitor unit 332 or conduct a signal transmission path between the gate of the second output transistor MN9 and the first terminal A of the capacitor unit 332. To be specific, the switch unit 334 described in the present embodiment includes a first switch SW1 and a second switch SW2. The first switch SW1 has a first terminal, a second terminal, and a control terminal. The first terminal of the first switch SW1 is coupled to the gate of the first output transistor MP9, the second terminal of the first switch SW1 is coupled to the first terminal A of the first capacitor CM1, and the control terminal of the first switch SW1 is controlled by an inverted control signal SB. The second switch SW2 has a first terminal, a second terminal, and a control terminal as well. The second terminal of the second switch SW2 is coupled to the gate of the second output transistor MN9, the first terminal of the second switch SW2 is coupled to the first terminal A of the first capacitor CM1, and the control terminal of the second switch SW2 is controlled by the control signal S.

According to the present embodiment, when the first switch SW1 conducts the signal transmission path between the gate of the first output transistor MP9 and the first terminal A of the first capacitor CM1, the second switch SW2 cuts off the signal transmission path between the gate of the second output transistor MN9 and the first terminal A of the first capacitor CM1. On the contrary, when the second switch SW2 conducts the signal transmission path between the gate of the second output transistor MN9 and the first terminal A of the first capacitor C1, the first switch SW1 cuts off the signal transmission path between the gate of the first output transistor MP9 and the first terminal A of the first capacitor CM1.

When the operational amplifier circuit 300 described in the present embodiment is applied to the digitally-controlled analog voltage driving circuit 100, the control signal S is the most significant bit (MSB) of the digital signal SD, for instance. When the MSB of the digital signal SD is 1 (MSB=1), the control signal S is 1, the inverted control signal SB is 0, and the control signal S and the inverted control signal SB conduct the signal transmission path between the gate of the first output transistor MP9 and the first terminal A of the capacitor unit 332 and cut off the signal transmission path between the gate of the second output transistor MN9 and the first terminal A of the first capacitor CM1. That is, when the operational amplifier circuit 330 is operated within a high-level output voltage range V2 to V3, the switch unit 334 switches to the signal transmission path between the gate of the first output transistor MP9 and the first terminal A of the capacitor unit 332, and the first capacitor CM1 compensates the operational amplifier circuit 330 and thereby improves the stability of the operational amplifier circuit 330.

On the other hand, when the MSB of the digital signal SD is 0 (MSB=0), the control signal S is 0, the inverted control signal SB is 1, and the control signal S and the inverted control signal SB conduct the signal transmission path between the gate of the second output transistor MN9 and the first terminal A of the first capacitor CM1 and cut off the signal transmission path between the gate of the first output transistor MP9 and the first terminal A of the capacitor unit 332. That is, when the operational amplifier circuit 330 is operated within a low-level output voltage range V1 to V2, the switch unit 334 switches to the signal transmission path between the gate of the second output transistor MN9 and the first terminal A of the first capacitor CM1, and the first capacitor CM1 compensates the operational amplifier circuit 330 and thereby improves the stability of the operational amplifier circuit 330.

Accordingly, in terms of the application of the digitally-controlled analog voltage driving circuit, the compensation of the stability of the operational amplifier circuit 330 may be achieved by configuring one single capacitor within the output stage circuit 330 in the present embodiment. The switching action of the switch unit 334 allows the single capacitor to compensate the operational amplifier circuit 330 within different output voltage level ranges. Hence, according to the present embodiment, the compensation capacitor does not occupy an excessively large area of the chip. Besides, the capacitance of the compensation capacitor may be adjusted to raise the slew rate.

Note that the control signal described in the present embodiment is not limited to the MSB of the 8-bit digital signal. Namely, the control signal may be any bit of the digital signal with any number of bits or may be set by designers based on actual demands. In addition, the application of the operational amplifier circuit described in the present embodiment is not limited to the digitally-controlled analog voltage driving circuit.

Figure 4:
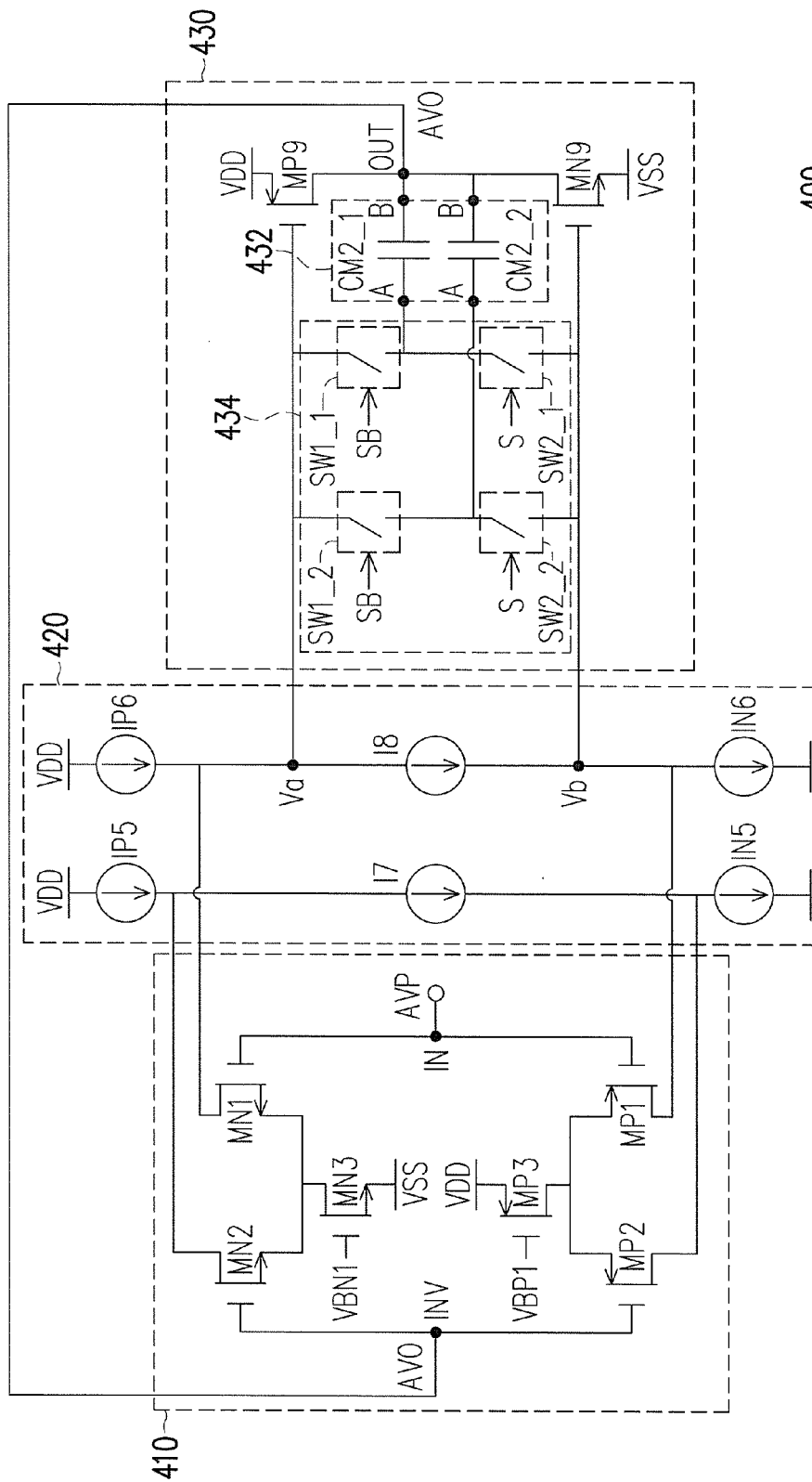
FIG. 4 is a schematic diagram outlining an operational amplifier circuit according to another embodiment of the invention.

FIG. 4 is a schematic diagram outlining an operational amplifier circuit according to another embodiment of the invention. With reference to FIG. 3 and FIG. 4, the operational amplifier circuit 400 described in the present embodiment is similar to the operational amplifier circuit 300 depicted in FIG. 3, while one of the differences therebetween lies in the circuitry structures of the capacitor units 432 and 332 and the switch units 434 and 334, which will be explained hereinafter.

The capacitor unit 432 described in the present embodiment includes a plurality of second capacitors. For illustrative purposes, two second capacitors CM2_1 and CM2_2 are depicted in FIG. 4, while the number of the second capacitors does not pose a limitation to the invention. Each of the second capacitors has a first terminal and a second terminal. Each of the first terminals of the second capacitors CM2_1 and CM2_2 is coupled to the first terminal A of the capacitor unit 432, and each of the second terminals of the second capacitors CM2_1 and CM2_2 is coupled to the second terminal B of the capacitor unit 432.

According to the present embodiment, the switch unit 434 includes a plurality of third switches and a plurality of fourth switches. For illustrative purposes, two third switches SW1_1 and SW1_2 and two fourth switches SW2_1 and SW2_2 are depicted in FIG. 4, while the number of the third switches and the number of the fourth switches do not pose a limitation to the invention. In the present embodiment, each of the third switches has a first terminal, a second terminal, and a control terminal. The third switch SW1_1 is taken as an example. Here, the first terminal of the third switch SW1_1 is coupled to the gate of the first output transistor MP9, the second terminal of the third switch SW1_1 is coupled to the first terminal A of the second capacitor CM2_1, and the control terminal of the third switch SW1_1 is controlled by the inverted control signal SB. The coupling relationship between the third switch SW1_2 and other circuit components may be deduced from FIG. 4 and therefore will not be further described hereinafter. It should be mentioned that the second terminals of the third switches SW1_1 and SW1_2 are respectively coupled to the first terminals A of different second capacitors CM2_1 and CM2_2.

In the present embodiment, each of the fourth switches has a first terminal, a second terminal, and a control terminal. The fourth switch SW2_1 is taken as an example. Here, the first terminal of the fourth switch SW2_1 is coupled to the first terminal A of the second capacitor CM2_1, the second terminal of the fourth switch SW2_1 is coupled to the gate of the second output transistor MN9, and the control terminal of the fourth switch SW2_1 is controlled by the control signal SB. The coupling relationship between the fourth switch SW2_2 and other circuit components may be deduced from FIG. 4 and therefore will not be further described hereinafter. It should be mentioned that the first terminals of the fourth switches SW2_1 and SW2_2 are respectively coupled to the first terminals A of different second capacitors CM2_1 and CM2_2.

From another perspective, if the second capacitor CM2_1, the third switch SW1_1, and the fourth switch SW2_1 are deemed as a compensation module, this compensation module is able to perform a compensation function which may be performed by the capacitor unit 332 and the switch unit 334 (shown in FIG. 3) in the same manner. Hence, the capacitor unit 432 and the switch unit 434 described in the present embodiment may be considered as a plurality of said compensation modules which are coupled to one another in parallel.

According to the present embodiment, when each of the third switches conducts the signal transmission path between the gate of the first output transistor MP9 and each of the first terminals A of the second capacitors, each of the fourth switches cuts off the signal transmission path between the gate of the second output transistor MN9 and each of the first terminals A of the second capacitors. By contrast, when each of the fourth switches conducts the signal transmission path between the gate of the second output transistor MN9 and each of the first terminals A of the second capacitors, each of the third switches cuts off the signal transmission path between the gate of the first output transistor MP9 and each of the first terminals A of the second capacitors.

In the event that there are plural second capacitors, if one of the third switches conducts the signal transmission path between the gate of the first output transistor MP9 and one of the first terminals A of the second capacitors, the other third switches cut off the signal transmission paths between the gate of the first output transistor MP9 and the first terminals A of the other second capacitors. For instance, as provided in the present embodiment, when the third switch SW1_1 conducts the signal transmission path between the gate of the first output transistor MP9 and the first terminal A of the second capacitor CM2_1, the third switch SW1_2 cuts off the signal transmission path between the gate of the first output transistor MP9 and the first terminal A of the second capacitor CM2_2.

Similarly, in the event that there are plural second capacitors, if one of the fourth switches conducts the signal transmission path between the gate of the second output transistor MN9 and one of the first terminals A of the second capacitors, the other fourth switches cut off the signal transmission paths between the gate of the second output transistor MN9 and the first terminals A of the other second capacitors. For instance, as provided in the present embodiment, when the fourth switch SW2_1 conducts the signal transmission path between the gate of the second output transistor MN9 and the first terminal A of the second capacitor CM2_1, the fourth switch SW2_2 cuts off the signal transmission path between the gate of the second output transistor MN9 and the first terminal A of the second capacitor CM2_2.

That is, in the present embodiment, only one of the third switches is turned on at a time, and only one of the fourth switches is turned on at a time. However, the invention is not limited thereto. According to another embodiment, some of the third switches may be turned on at a time, while the other third switches are turned off at a time. Likewise, some of the fourth switches may be turned on at a time, while the other fourth switches are turned off at a time.

For instance, in the event that there are three or more second capacitors, if a first part of the third switches (e.g., some of the third switches) conducts the signal transmission paths between the gate of the first output transistor MP9 and the first terminals A of one part of the second capacitors, a second part of the third switches (e.g., the rest of the third switches) cuts off the signal transmission paths between the gate of the first output transistor MP9 and the first terminals A of the other second capacitors. Similarly, if a first part of the fourth switches (e.g., some of the fourth switches) conducts the signal transmission paths between the gate of the second output transistor MN9 and the first terminals A of one part of the second capacitors, a second part of the fourth switches (e.g., the rest of the fourth switches) cuts off the signal transmission paths between the gate of the second output transistor MN9 and the first terminals A of the other second capacitors.

Figure 5:
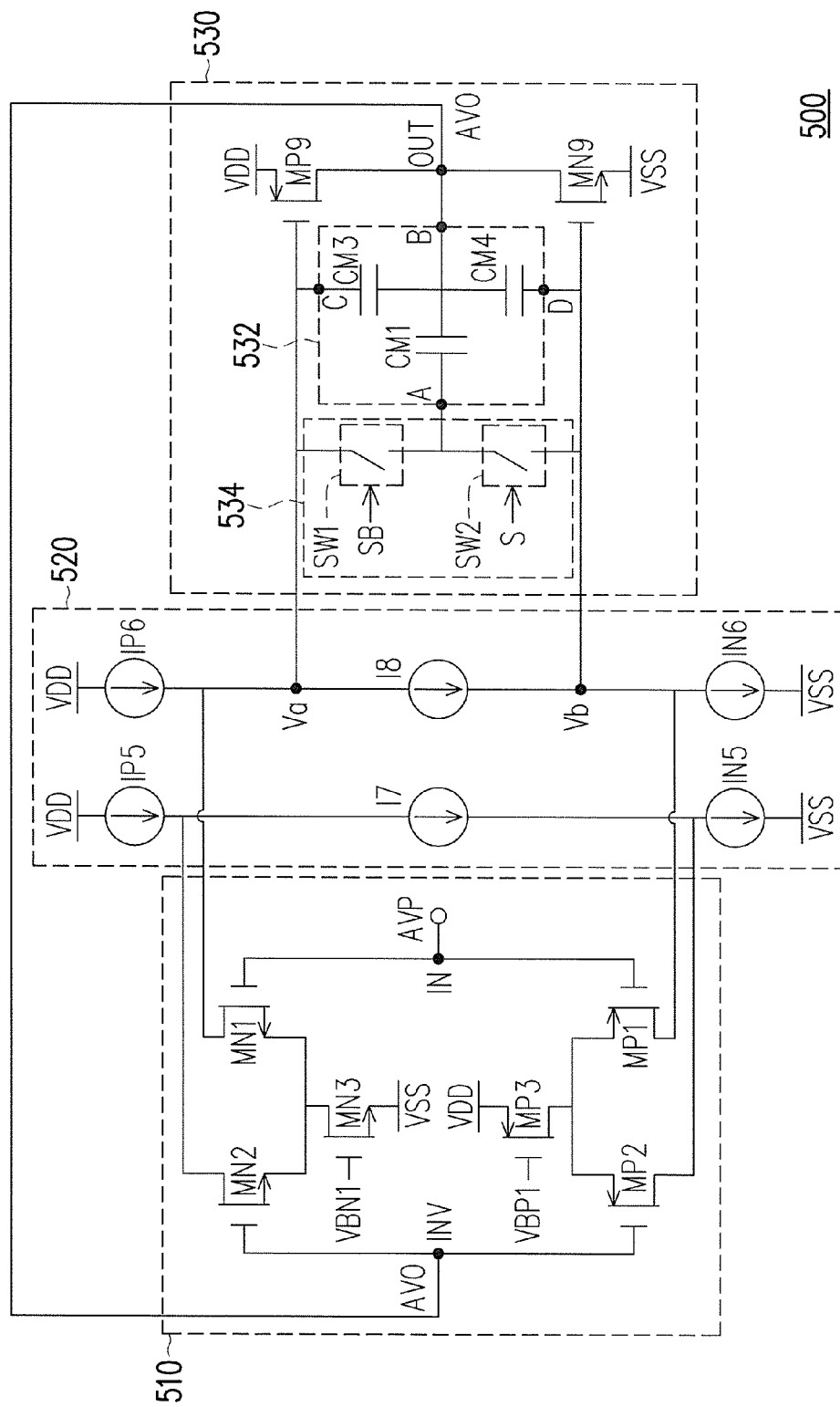
FIG. 5 is a schematic diagram outlining an operational amplifier circuit according to another embodiment of the invention.

FIG. 5 is a schematic diagram outlining an operational amplifier circuit according to another embodiment of the invention. With reference to FIG. 3 and FIG. 5, the operational amplifier circuit 500 described in the present embodiment is similar to the operational amplifier circuit 300 depicted in FIG. 3, while one of the differences therebetween lies in the circuitry structures of the capacitor units 532 and 332, which will be explained hereinafter.

The capacitor unit 532 described in the present embodiment has a third terminal C and a fourth terminal D. The third terminal C of the capacitor unit 532 is coupled to the gate of the first output transistor MP9, and the fourth terminal D of the capacitor unit 532 is coupled to the gate of the second output transistor MN9. Specifically, according to the present embodiment, the capacitor unit 532 further includes a third capacitor CM3 and a fourth capacitor CM4. The third capacitor CM3 has a first terminal and a second terminal. The first terminal of the third capacitor CM3 is coupled to the gate of the first output transistor MP9, and the second terminal of the third capacitor CM3 is coupled to the output terminal OUT of the output stage circuit 530. The fourth capacitor CM4 has a first terminal and a second terminal. The second terminal of the fourth capacitor CM4 is coupled to the gate of the second output transistor MN9, and the first terminal of the fourth capacitor CM4 is coupled to the output terminal OUT of the output stage circuit 530.

In terms of operation of circuits, when the first switch SW1 is switched on and the second switch SW2 is switched off, the first capacitor CM1 and the third capacitor CM3 are coupled in parallel and equivalent to a compensation capacitor, so as to compensate the operational amplifier circuit 500. On the contrary, when the second switch SW2 is switched on and the first switch SW1 is switched off, the first capacitor CM1 and the fourth capacitor CM4 are coupled in parallel and equivalent to another compensation capacitor, so as to compensate the operational amplifier circuit 500.

To sum up, according to an embodiment of the invention, the output stage circuit includes the capacitor unit and the switch unit. The operational amplifier circuit switches the switch unit according to the control signal, such that the capacitor unit is able to compensate the operational amplifier circuit based on different voltage ranges. Through said design, the compensation capacitor in the operational amplifier circuit does not occupy an excessively large area of the chip, and the driving capacity of the operational amplifier circuit can also be enhanced.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. An operational amplifier circuit comprising:
   an input stage circuit having an input terminal, the input terminal receiving an input signal;
   a bias circuit coupled to the input stage circuit, the bias circuit providing a bias current to the input stage circuit; and
   an output stage circuit coupled to the bias circuit, the output stage circuit having an output terminal providing an output signal and comprising:
      a pair of output transistors comprising a first output transistor and a second output transistor, a first source/drain of the first output transistor being coupled to a first source/drain of the second output transistor via the output terminal of the output stage circuit;
      a capacitor unit having a first terminal and a second terminal, the second terminal of the capacitor unit being coupled to the output terminal of the output stage circuit; and
      a switch unit coupled between a gate of the first output transistor and a gate of the second output transistor and coupled to the first terminal of the capacitor unit,
      wherein the switch unit determines to conduct one of a first signal transmission path between the gate of the first output transistor and the first terminal of the capacitor unit and a second signal transmission path between the gate of the second output transistor and the first terminal of the capacitor unit according to an output voltage range of the output signal,
      wherein an output voltage range of the output signal comprises a first voltage range and a second voltage range, and the switch unit conducts one of the first signal transmission path and the second signal transmission path when the output signal is in the first voltage range and conducts the other one of the first signal transmission path and the second signal transmission path when the output signal is in the second voltage range.

2. The operational amplifier circuit as recited in claim 1, wherein the capacitor unit comprises:
   a first capacitor having a first terminal and a second terminal, the first terminal of the first capacitor being coupled to the first terminal of the capacitor unit, the second terminal of the first capacitor being coupled to the second terminal of the capacitor unit.

3. The operational amplifier circuit as recited in claim 2, wherein the switch unit comprises:
   a first switch having a first terminal, a second terminal, and a control terminal, the first terminal of the first switch being coupled to the gate of the first output transistor, the second terminal of the first switch being coupled to the first terminal of the first capacitor, the control terminal of the first switch being controlled by an inverted signal of a control signal; and
   a second switch having a first terminal, a second terminal, and a control terminal, the second terminal of the second switch being coupled to the gate of the second output transistor, the first terminal of the second switch being coupled to the first terminal of the first capacitor, the control terminal of the second switch being controlled by the control signal.

4. The operational amplifier circuit as recited in claim 3, wherein when the first switch conducts the signal transmission path between the gate of the first output transistor and the first terminal of the first capacitor, the second switch cuts off the signal transmission path between the gate of the second output transistor and the first terminal of the first capacitor, and when the second switch conducts the signal transmission path between the gate of the second output transistor and the first terminal of the first capacitor, the first switch cuts off the signal transmission path between the gate of the first output transistor and the first terminal of the first capacitor.

5. The operational amplifier circuit as recited in claim 1, wherein the capacitor unit comprises:
a plurality of second capacitors, each of the second capacitors having a first terminal and a second terminal, each of the first terminals of the second capacitors being coupled to the first terminal of the capacitor unit, each of the second terminals of the second capacitors being coupled to the second terminal of the capacitor unit.

6. The operational amplifier circuit as recited in claim 5, wherein the switch unit comprises:
a plurality of third switches, each of the third switches having a first terminal, a second terminal, and a control terminal, each of the first terminals of the third switches being coupled to the gate of the first output transistor, each of the second terminals of the third switches being exclusively coupled to one of the first terminals of the second capacitors, each of the control terminals of the third switches being controlled by an inverted signal of a control signal; and
a plurality of fourth switches, each of the fourth switches having a first terminal, a second terminal, and a control terminal, each of the second terminals of the fourth switches being coupled to the gate of the second output transistor, each of the first terminals of the fourth switches being exclusively coupled to one of the first terminals of the second capacitors, each of the control terminals of the fourth switches being controlled by the control signal.

7. The operational amplifier circuit as recited in claim 6, wherein when each of the third switches conducts the signal transmission path between the gate of the first output transistor and each of the first terminals of the second capacitors, each of the fourth switches cuts off the signal transmission path between the gate of the second output transistor and each of the first terminals of the second capacitors, and when each of the fourth switches conducts the signal transmission path between the gate of the second output transistor and each of the first terminals of the second capacitors, each of the third switches cuts off the signal transmission path between the gate of the first output transistor and each of the first terminals of the second capacitors.

8. The operational amplifier circuit as recited in claim 6, wherein when one of the third switches conducts the signal transmission path between the gate of the first output transistor and one of the first terminals of the second capacitors, the other third switches cut off the signal transmission paths between the gate of the first output transistor and the first terminals of the other second capacitors.

9. The operational amplifier circuit as recited in claim 6, wherein when a first part of the third switches conducts the signal transmission paths between the gate of the first output transistor and the first terminals of a first part of the second capacitors, a second part of the third switches cuts off the signal transmission paths between the gate of the first output transistor and the first terminals of a second part of the second capacitors.

10. The operational amplifier circuit as recited in claim 6, wherein when one of the fourth switches conducts the signal transmission path between the gate of the second output transistor and one of the first terminals of the second capacitors, the other fourth switches cut off the signal transmission paths between the gate of the second output transistor and the first terminals of the other second capacitors.

11. The operational amplifier circuit as recited in claim 6, wherein when a first part of the fourth switches conducts the signal transmission paths between the gate of the second output transistor and the first terminals of a first part of the second capacitors, a second part of the fourth switches cuts off the signal transmission paths between the gate of the second output transistor and the first terminals of a second part of the second capacitors.

12. The operational amplifier circuit as recited in claim 1, wherein the capacitor unit further has a third terminal and a fourth terminal, the third terminal of the capacitor unit is coupled to the gate of the first output transistor, and the fourth terminal of the capacitor unit is coupled to the gate of the second output transistor.

13. The operational amplifier circuit as recited in claim 12, wherein the capacitor unit comprises:
a third capacitor having a first terminal and a second terminal, the first terminal of the third capacitor being coupled to the gate of the first output transistor, the second terminal of the third capacitor being coupled to the output terminal of the output stage circuit; and
a fourth capacitor having a first terminal and a second terminal, the second terminal of the fourth capacitor being coupled to the gate of the second output transistor, the first terminal of the fourth capacitor being coupled to the output terminal of the output stage circuit.

14. The operational amplifier circuit as recited in claim 1, wherein the output terminal of the output stage circuit is coupled to the input terminal of the input stage circuit to constitute a feedback circuit configuration.

15. The operational amplifier circuit as recited in claim 1, wherein a second source/drain of the first output transistor is coupled to a first system voltage, and a second source/drain of the second output transistor is coupled to a second system voltage.

16. The operational amplifier circuit as recited in claim 1, wherein the switch unit is controlled by a control signal and the control signal is a most significant bit of a digital signal corresponding to the input signal.

17. An operational amplifier circuit comprising:
an input stage circuit having an input terminal, the input terminal receiving an input signal;
a bias circuit coupled to the input stage circuit, the bias circuit providing a bias current to the input stage circuit; and
an output stage circuit coupled to the bias circuit, the output stage circuit having an output terminal and comprising:
a pair of output transistors comprising a first output transistor and a second output transistor, a first source/drain of the first output transistor being coupled to a first source/drain of the second output transistor via the output terminal of the output stage circuit;
a capacitor unit having a first terminal and a second terminal, the second terminal of the capacitor unit being coupled to the output terminal of the output stage circuit; and
a switch unit coupled between a gate of the first output transistor and a gate of the second output transistor and coupled to the first terminal of the capacitor unit, wherein the switch unit determines to conduct one of a first signal transmission path between the gate of the first output transistor and the first terminal of the capacitor unit and a second signal transmission path between the gate of the second output transistor and the first terminal of the capacitor unit according to a control signal, wherein an input voltage range of the input signal comprises a first voltage range and a second voltage range, and the control signal is generated according to a digital signal corresponding to the first voltage range and the second voltage range of the input signal.

18. An operational amplifier circuit comprising:

an input stage circuit receiving an input signal of the operational amplifier circuit; and an output stage circuit, comprising:
- a plurality of input ends coupled to the input stage circuit;
- an output ends providing an output signal;
- a compensation device comprising one or more compensation capacitor units, coupled to the input ends of the output stage circuit via a plurality of switchable signal transmission paths and coupled to the output end of the output stage circuit; and
- a switch unit configured to switch respective conductive states of the switchable signal transmission paths according to an output voltage range of the output signal,
- wherein an output voltage range of the output signal comprises a first voltage range and a second voltage range, and the switch unit conducts a first one of the switchable signal transmission paths when the output signal is in the first voltage range and conducts a second one of the switchable signal transmission paths when the output signal is in the second voltage range.

* * * * *